(12) United States Patent
Chen et al.

(10) Patent No.: US 6,794,302 B1
(45) Date of Patent: Sep. 21, 2004

(54) DYNAMIC FEED FORWARD TEMPERATURE CONTROL TO ACHIEVE CD ETCHING UNIFORMITY

(75) Inventors: Li-Shiun Chen, Hsinchu (TW); Ming-Ching Chang, Taipei (TW); Huan-Just Lin, Hsin-Chu (TW); Li-Te S. Lin, Hsin-Chu (TW); Yung-Hog Chiu, Taipei (TW); Hun-Jan Tao, Hsinchu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/393,909

(22) Filed: Mar. 20, 2003

(51) Int. Cl.[7] .............................................. H01L 21/302
(52) U.S. Cl. ........................... 438/714; 438/715; 438/9; 216/59; 216/67
(58) Field of Search ................................ 438/714, 7, 8, 438/9, 10, 11, 715; 216/59, 60, 61, 67

(56) References Cited

U.S. PATENT DOCUMENTS 5,200,023 A * 4/1993 Gifford et al. .............. 156/626
5,334,251 A * 8/1994 Nashimoto .................. 118/725
5,990,016 A * 11/1999 Kim et al. ................... 438/707

FOREIGN PATENT DOCUMENTS

| JP | 59-094421 | * | 5/1984 |
| JP | 61-010238 | * | 1/1986 |
| JP | 09-017770 | * | 1/1997 |

* cited by examiner

Primary Examiner—George A. Goudreau
(74) Attorney, Agent, or Firm—Tung & Assocaites

(57) ABSTRACT

A method for compensating CD variations across a semiconductor process wafer surface in a plasma etching process including a semiconductor wafer having a process surface comprising patterned features; carrying out a first plasma etching process wherein the semiconductor wafer is heated to at least two selectively controllable temperature zones; determining a first dimensional variation of etched features with respect to reference dimensions over predetermined areas of the process surface including the two selectively controllable temperature zones; determining operating temperatures for the two selectively controllable temperature zones to achieve a targeted dimensional variation change in the first dimensional variation to achieve a desired second dimensional variation; plasma etching the process surface to the desired operating temperatures; and, determining an actual dimensional variation change for use in at least one subsequent plasma etching process.

20 Claims, 2 Drawing Sheets

DYNAMIC FEED FORWARD TEMPERATURE CONTROL TO ACHIEVE CD ETCHING UNIFORMITY

FIELD OF THE INVENTION

This invention generally relates to plasma reactor processes including dry etching processes and more particularly to a temperature control methodology for dynamically adjusting wafer temperature zone parameters in a plasma etching process to achieve critical dimension (CD) uniformity.

BACKGROUND OF THE INVENTION

In the field of plasma (dry) etching, various processing parameters including, for example, RF power, RF bias, pressure, gas flow rate, temperature, and vacuum conditions are predetermined in order to accomplish a particular plasma etching process. In addition, many plasma etching processes are preprogrammed to follow a series of steps for predetermined time periods also referred to as a process recipe, where the processing parameters may be altered at each step to achieve a desired etching result.

While there are several types of plasma reactor configurations including a wide variety of gaseous reactants used for etching a semiconductor wafer to form semiconductor features, some etching processes are mores susceptible to wafer temperature than others. For example the temperature of the process wafer determines the rate of chemical reactions that take place on the wafer surface in an etching process including deposition and etching away of polymers in etching high aspect ratio features including for example, openings as well as protrusions. For example, the wafer temperature may affect the etching rate, especially in reaction controlled processes. Temperature control of a semiconductor wafer during an etching process is becoming increasingly critical as semiconductor feature sizes decrease and the diameter of process wafers increases. For example, it is frequently required to achieve a critical dimension etching uniformity of less than about 3 nm in some processes, for example in gate etching to adequately control gate length which critically affects electrical function of the transistor.

For example, where the etch reaction is the dominant removal process. Since the etch reaction is affected by the wafer temperature, local gradients in the wafer temperature may result in differing etching rates thereby resulting in different critical dimension uniformity over the wafer surface. Other etching processes may be dominated by the recombination of gas species, for example including chlorine atoms may be strongly influenced by the wafer temperature.

Since process wafers are frequently heated during etching, for example from a backside by an electrostatic chuck including a heating means, the wafer temperature may vary over a diameter of the wafer due to radial heat transfer. Thus, critical dimension (CD) non-uniformities caused by temperature variations of the semiconductor wafer may vary concentrically from wafer center to edge. Etching non-uniformities including edge to edge non-uniformities also referred to as a leveling effect adversely affect subsequent photolithographic processes by causing defocusing difficulties in transferring mask images to the wafer surface.

A device sizes, including transistors are scaled down to below about 1 micron, CD requirements have become more stringent and difficult to control. For example, two parameters known as bias and tolerance are frequently used to define CD requirements in the semiconductor processing art. CD Bias is the difference in lateral dimension between the etched image and the mask image. CD uniformity is a measure of the statistical distribution, for example 3x sigma, of CD bias values that characterized the uniformity of etching. For example, in etching polysilicon gate structures, the gate length determines the channel length and the acceptable electronic functioning of a transistor making gate CD uniformity critical in the gate formation process. Non-uniform etching rates over the diameter of the process wafer are frequently strongly influenced by the temperature of the process wafer may adversely affect the manufacture of the transistor device in several ways. For example, wafer edge-to-edge (across wafer diameter) variations in etching rates cause CD non-uniformities within the wafer, for example concentrically, which contribute to defocus in subsequent photolithographic processes. As a result, the etching non-uniformities compound CD bias in subsequent process steps. A goal in the semiconductor manufacture process industry is to achieve CD uniformity to within less than about 30 Angstroms.

A problem in prior art etching processes and systems is the limitation of carrying out etching processes by trial and error. Since a plasma etching process is frequently a multi-step process to etch through a series of different material layers, it is frequently difficult to determine after the fact which etching process was a major contributor to the CD non-uniformity. Further, CD inspection is frequently accomplished after the etching process is complete causing a waste of time and resources if the CD uniformity is not within specifications. Frequently, temperature control adjustment in a plasma etching process is a 'black art' limited by trial and error techniques to obtain the desired CD uniformity. Changes in one of several components of the plasma reactor system over time may unpredictably change heat transfer characteristics and consequently wafer process temperatures including gas pressures and gas flow rates which also must be frequently adjusted to maintain CD uniformity. Further, etching parameters are frequently required to be altered from one etching process to another, making the re-establishment of optimal etching parameters including optimal gas flow characteristics time consuming and frequently limited to reliance on a trial and error approach.

Thus, there is a need in the semiconductor processing art to develop an improved wafer temperature control methodology for in a plasma etching process to compensate for CD non-uniformity and achieve repeatable and predictable CD uniformity.

It is therefore an object of the invention to provide an improved wafer temperature control methodology for in a plasma etching process to compensate for CD non-uniformity and achieve repeatable and predictable CD uniformity while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for compensating for CD variations across a semiconductor process wafer surface in a plasma etching process.

In a first embodiment, the method includes providing a semiconductor wafer having a process surface comprising patterned features; carrying out a first plasma etching process wherein the semiconductor wafer is heated according to at least two selectively controllable temperature zones; determining a first dimensional variation of etched features with respect to reference dimensions over predetermined areas of the process surface including the at least two selectively controllable temperature zones; determining operating temperatures for the at least two selectively controllable temperature zones to achieve a targeted dimensional variation change in the first dimensional variation to achieve a desired second dimensional variation in a subsequent etching process; plasma etching the process surface according to the desired operating temperatures; and, determining an actual dimensional variation change for use in at least one subsequent plasma etching process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
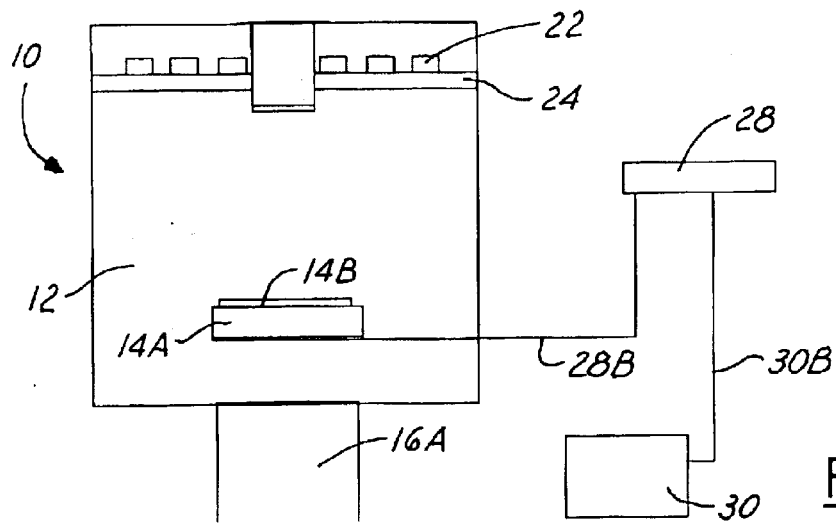
FIGS. 1A is a schematic representation of an exemplary plasma reactor including a portion of a process wafer temperature control system according to embodiments of the present invention.

Referring to FIG. 1, in an exemplary implementation of the present invention, is shown an exemplary plasma reactor 10 showing a portion of an exemplary wafer temperature control system including a reactor chamber 12. The plasma reactor 10 may include any plasma reactor including a gas flow supply to the plasma reactor, a vacuum pumping system to maintain a plasma operating pressure, and a means to ignite a plasma within the plasma reactor. The plasma reactor 10, for example, is an inductively coupled plasma (ICP) reactor or a transformer coupled plasma (TCP) reactor. A reactor chamber 12, preferably includes a wafer holding means 14A, for example an electrostatic chuck (ESC) for holding process wafer 14B, for example, disposed in the lower part of the reactor chamber 12 above a vacuum pumping pathway 16A, communicating with a vacuum pumping system, for example including one or more turbomolecular pumps (not shown), and one or more mechanical roughing pumps (not shown).

Preferably, the plasma reactor 10 includes a gas feeding means 20, for example, disposed in an upper portion of the reactor chamber 12, for example, including a plurality of individually gas flow rate adjustable gas feed lines for delivering selected gas flow rates to preferentially contact portions of the process wafer 14B. The plasma reactor, for example also includes an RF power coil e.g., 22 and dielectric window 24 for coupling RF power into the reactor chamber 12.

Figure 2A:
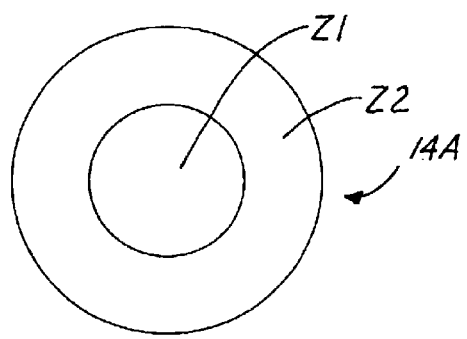
FIGS. 2A–2B are a top view of an electrostatic chuck showing a plurality of temperature control zones used for adjusting the wafer temperature according to an embodiment of the present invention.
Figure 2B:
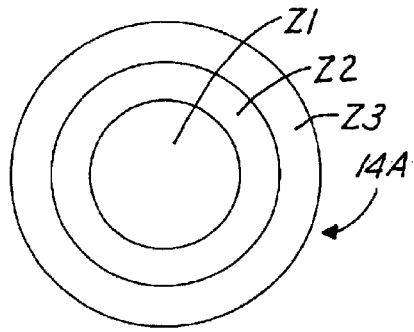

Referring to FIG. 2A, is shown a top view of the wafer holding means (wafer holder) 14A, for example an electrostatic chuck, preferably including at least 2 concentrically disposed heating temperature zones e.g., Z1 and Z2 disposed radially concentric with respect to one another along the wafer holder surface. The wafer holding means may optionally include more than 2, for example 3 concentrically disposed heating temperature zones as shown in FIG. 2B, e.g., Z1, Z2, and Z3. The heating temperature zones are preferably configured have independently selectable and controllable set point operating temperatures. For example each of the zones preferably includes one or more temperatures sensors and heating means communicating with a controller for controllably setting an operating temperature within each respective heating temperature zone. The temperature within each zone may be controlled, for example, by separately controllable resistive heating elements or separately controllable heat exchange fluid pathways disposed within the wafer holding means in heat transfer relationship with the surface of the wafer holding means and mounted wafer 14A.

Referring again to FIG. 1, wafer holder 14A, for example an electrostatic chuck including heating temperature zones are in programmable and responsive communication with a controller 28 for increasing or decreasing an operating temperature of the heating temperature zones, for example by means of communication line 28B. By programmable and responsive communication is meant preferably two-way communication with the controller for sending and receiving data communications, for example receiving temperature sensor data and sending commands for controlling a voltage or current through resistive heating elements within the respective temperature zones. In addition, the controller 28 may be in communication with a server e.g., 30 by means of communication line 30B the server including at least a computer readable storage media and a processor for processing computer readable instructions in the form of a computer program for plasma reactor process control. Preferably the server 30 includes a graphical user interface for visually displaying collected and archived data and entering commands for controlling the plasma process. For example, the process control programs may include batch operation mode and real-time interactive operation mode including a graphical user interface where independent process variables may be selectively altered or overridden in real time. It will be appreciated that the controller, server, and graphical user interface may be disposed remotely from one another or may be included in a combined configuration.

According to one embodiment of the present invention, a semiconductor process wafer is subjected to a photolithographic patterning process. Following development of the photoresist, a first set of critical dimension (CD) measurements are performed on the patterned semiconductor features over predetermined measurement areas of the process wafer surface and archived, for example entered into a database, preferably a relational database, the CD measurements associated with the particular process wafer orientation and photomask used to pattern the semiconductor features. Preferably, CD variation values are determined from the CD measurements including CD bias values and/or CD uniformity values. For example, CD Bias is the difference in lateral dimension between the etched image and the mask image. CD uniformity is a measure of the statistical distribution, for example 3x sigma, of CD bias values that characterize the variation in CD bias values. For example, the CD variation values are associated with an X an Y coordinate corresponding to the predetermined measurement areas of the wafer process surface. In addition, the wafer process areas between the measurement areas are preferably interpolated according to a mathematical relationship representing a change in a CD variation value with a change in wafer surface location. CD variation values may be further processed by known methods to create a CD map, for example a 3-dimensional CD variation map. The CD variation data is used to determine a desired change in the CD variation with respect to the process wafer surface, for example a desired change in a grid of CD measurement areas including interpolated values over the process wafer surface. The desired change in the CD variation values is associated with wafer zone temperatures in a plasma etching process including at least two temperature zones on the wafer surface corresponding to respective temperature zones in the wafer holder in heat exchange relationship with the process wafer. A target zone temperature for each of the temperature zones is selected to achieve a targeted change in CD variation, for example, within a predetermined CD variation window.

The CD variation values are determined by a first set of CD measurements over predetermined areas of the process wafer surface, for example by conventional optical microscope and/or scanning electron microscopic examination following either a photoresist development process or a plasma etching process. A first set of CD variation values, for example, can be determined by comparing the first set of CD measurements to CD values obtained from the photolithographic mask. Following determination of the magnitude of the CD variation over the wafer surface, target zone temperatures (set-points), are determined by querying a database including previous plasma etching data relating a CD variation change with a respective zone temperature. For example, etching rates may be selectively varied across the diameter of the process surface by selectively controlling the operating temperature of zone temperatures and thereby the corresponding zone temperatures of the process wafer. With properly selected zone temperatures, CD variation changes may be effected in a subsequent plasma etching process to compensate for existing CD variation thereby achieving a CD variation within a predetermined CD variation window.

Preferably, the relational database is supplied with a desired CD variation change and queried to determine appropriate zone temperatures to obtain the CD variation change. The desired change in CD variation to attain a CD variation within a predetermined CD variation window can be represented by a mathematical relationship between respective zone temperatures and a resulting change in CD variation values determined from previous plasma etching processes. For example, a preprogrammed set of instructions determines the desired zone temperatures to produce a desired change in CD variation with respect to a particular concentric radial portion of the wafer corresponding to a controllable temperature zone of the wafer holding means.

For example, the query may include supplying a desired CD variation change for input into a previously determined mathematical relationship between CD variation and zone temperature to output a desired zone temperature. Alternatively, a desired CD variation change is supplied for comparison to an archived set of CD variation changes and associated zone temperatures for a linear or non-linear least squares analysis to determine a mathematical relationship between change in CD variation and zone temperature within each temperature zone. The determined mathematical relationship is then used to determine the zone temperature to achieve the desired change in CD variation within each temperature zone. Alternatively, the desired change in CD variation is compared previous plasma etching process zone temperatures and CD variation change to determine a zone temperature that most closely produces the targeted change in CD variation. The change in CD variation is determined from a second set of CD measurements following a plasma etching process compared to a previous set of CD measurements obtained for example, following a photolithographic patterning process or a previous etching process carried out on the same process wafer. The CD measurements may be mathematically transformed into CD variation values, for example including 3x sigma values (CD uniformity) associated with a plurality of CD bias measurements made over predetermined areas of the process wafer surface.

In an exemplary implementation of the present invention a multiple step etching process is carried out. For example in etching semiconductor features multiple layers must be etched through requiring several etching steps with different etching chemistries. For example, following photolithographic patterning and obtaining a first set of CD measurement values, a first dielectric layer, for example a bottom anti-reflectance coating (BARC) is etched through a thickness to expose an underlying layer. The semiconductor process wafer is transferred to an inspection station, for example a CD SEM, for determining a second set of CD measurement values.

Figure 3A:
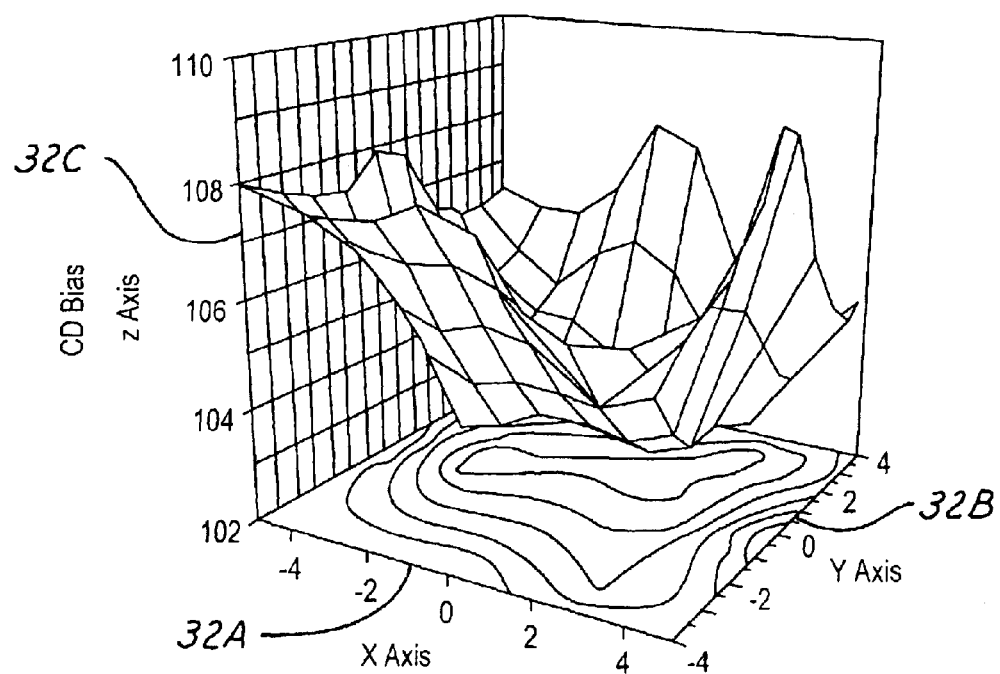
FIGS. 3A is a 3-dimensional representation of a process wafer surface CD uniformity following a first plasma etching process before temperature zone adjustment according to embodiments of the present invention.

For example, referring to FIG. 3A is shown an exemplary 3-dimensional map of CD variation values (e.g., CD bias) over a wafer surface. Shown are an X axis 32A and a Y axis 32B corresponding to wafer process surface coordinates and a Z axis 32C representing CD bias. The CD variation data in 3-dimensions represents a 3-dimension pictorial view of CD variation over the wafer process surface. For example, referring to FIG. 3A it is seen that the CD bias is relatively greater at the wafer edge corresponding to an outer temperature zone of the wafer and wafer holding surface. For example, the wafer holder includes two radially concentric temperature zones including an inner and outer temperature zone similar to that shown in FIG. 2A but may include multiple radially concentric temperature zones as shown in FIG. 2B. For example, the inner and outer temperature zones in the first etching process were about equal at a 60° C. operating temperature. Following obtaining the second set of CD measurement values and determining a CD variation, desired (target) zone temperatures for a subsequent etching process were determined to achieve a targeted change in CD variation, for example setting the outer temperature zone at 65° C. and the inner temperature zone at 55° C.

Figure 3B:
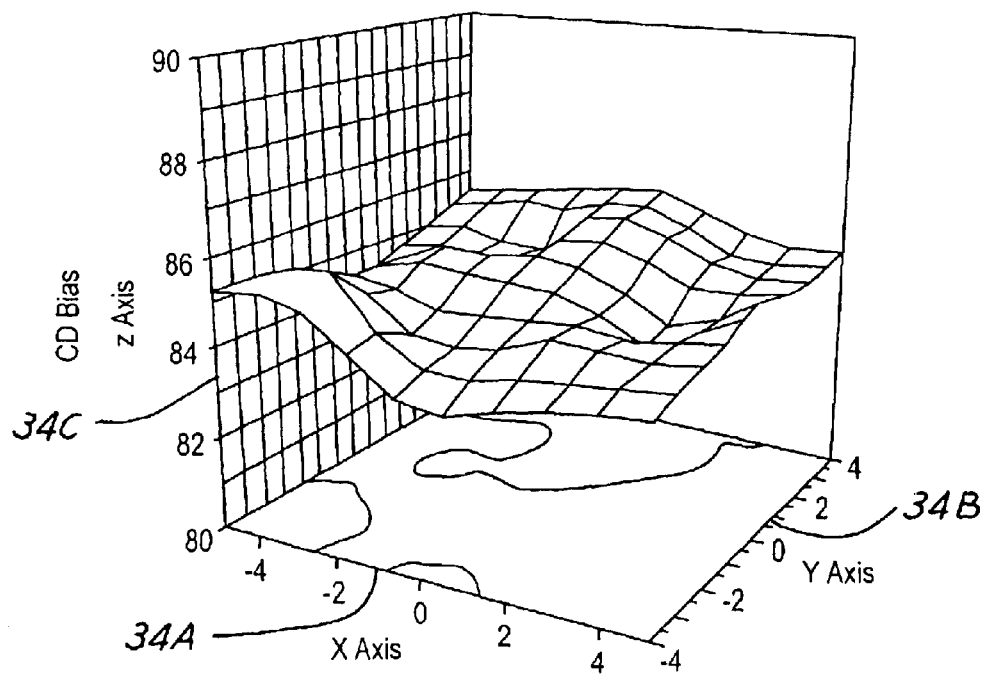
FIG. 3B is a 3-dimensional representation of a process wafer surface CD uniformity following a second plasma etching process following temperature zone adjustment according to embodiments of the present invention.

Referring to FIG. 3B, a similar 3-dimensional CD variation map is produced following a second plasma etching carried out at target zone temperatures process and following another CD measurement process. Shown is X axis 34A and Y axis 34B corresponding to wafer process surface coordinates and Z axis 34C representing CD bias where measurement values have been taken over the same measurement areas of the process wafer surface. The wafer is preferably oriented in a predetermined manner in both the inspection station and in the plasma etch reactor and the same CD measurement areas are used for CD measurement comparisons. It is seen in FIG. 3B that the CD bias (CD variation value) over the wafer surface is significantly improved to achieve a desired CD variation within a CD variation window, for example having a CD variation of less than about 3 nm.

Following obtaining the third set of CD measurements, a CD variation change is determined by comparing the second set of CD measurements and associated zone temperatures with the third set of CD measurements and associated zone temperatures to determine a CD variation change with temperature relationship followed by updating (archiving) a database of such values. For example the database optionally includes mathematical transformations, such as 3× Sigma values, and a mathematical relationship (leveling correlation) between CD variation change and zone temperature. Thus the most recent data corresponding to CD variation change with zone temperature change is fed forward to update the database for use in a subsequent plasma etching process thereby making the process a dynamic feed forward process. The process is then repeated for a subsequent plasma etching process on the same wafer or another plasma etching process on another wafer.

For example, the database may be continually expanded with newly fed-forward CD measurement data including a leveling correlation following a plasma etching process and/or the database may be updated by selectively replacing data associated with previous plasma etching processes and zone temperature parameters depending on a predetermined age of the data or a predetermined variation window or error of the archived data compared with the most recent data, thus dynamically accounting for changes in time dependent plasma reactor and process variables.

Figure 4:
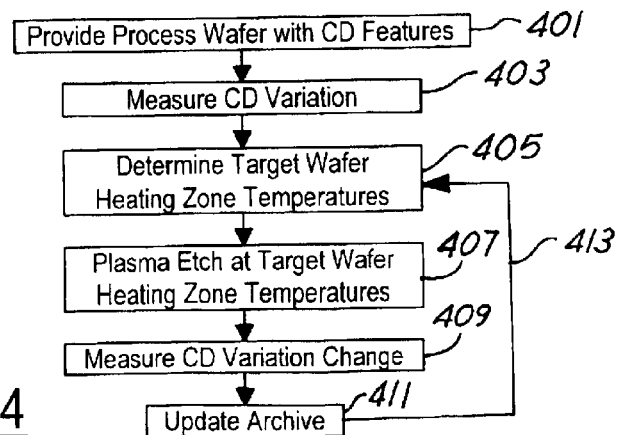
FIG. 4 is a process flow diagram including several embodiments of the present invention.

Referring to FIG. 4 is shown a process flow diagram including several embodiments of the present invention. In process 401 a process wafer is provided comprising semiconductor features and associated critical dimensions (CD). In process 403, a first set of CD measurement values are obtained over predetermined areas of the process wafer surface to determine a first CD variation. In process 405 target wafer heating zone temperatures to achieve a desired change in CD variation are determined by referring to a previously determined relationship between wafer heating zone temperatures and CD variation including CD variation change. In process 407, a plasma etching process is carried out at target wafer heating zone temperatures. In process 409, a CD variation including CD variation change is determined. In process 411 the CD variation change with associated plasma process parameters including wafer heating zone temperatures are archived and used to determine an updated relationship between wafer zone temperature and CD variation including CD variation change. As indicated by process directional arrow 413, processes 405 followed by processes 407, 409 and 411 are optionally repeated in a dynamic feed forward method to adjust wafer heating zone temperatures to achieve CD uniformity.

Thus a method has been provided to compensate for CD variations associated with CD non-uniformities over a wafer process surface by selectively adjusting wafer temperature zones, for example at least two radially concentric temperature zones, to achieve CD uniformity by a dynamic feed forward process. As a result, wafer temperatures can be selectively adjusted to achieve a targeted CD variation across a wafer surface in a subsequent plasma etching process thereby eliminating a blind trial and error approach. In addition, by dynamically updating a database, time dependent variations in plasma etching rates due to variations in plasma etching parameters are dynamically accounted for, making the control of CD uniformity in a plasma etching process more predictable and reliable.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for compensating for CD variations across a semiconductor process wafer surface in a feed forward multi-step plasma etching process to achieve CD uniformity comprising the steps of:

providing a semiconductor wafer having a process surface comprising patterned features for plasma etching;

carrying out a first plasma etching process wherein the semiconductor wafer is heated to a first set of operating temperatures according to at least two selectively controllable temperature zones;

determining a first dimensional variation of etched features with respect to reference dimensions over areas of the process surface comprising the at least two selectively controllable temperature zones;

determining a second set of operating temperatures for the at least two selectively controllable temperature zones to achieve a targeted dimensional variation less than the first dimensional variation;

plasma etching the process surface according to the second set of operating temperatures; and, determining and archiving a second dimensional variation correlated with the second set of operating temperatures for determining a third set of operating temperatures for carrying out a subsequent plasma etching process.

2. The method of claim 1, wherein the at least two selectively controllable temperature zones comprise a wafer holding surface in heat exchange relationship with the semiconductor wafer.

3. The method of claim 2, wherein the at least two selectively controllable temperature zones are disposed radially concentric to one another contacting a backside of the semiconductor wafer.

4. The method of claim 1, wherein the step of determining a second set of operating temperatures further comprises reference to a previously determined mathematical relationship between operating temperatures and dimensional variations following a plasma etching process.

5. The method of claim 1, wherein the step of determining a second set of operating temperatures further comprises reference to an archive of previous operating temperatures and dimensional variations following a plasma etching process.

6. The method of claim 5, wherein the archive comprises a relational database.

7. The method of claim 1, further comprising minimizing a difference between the targeted dimensional variation and the archived dimensional variations.

8. The method of claim 7, wherein minimizing a difference comprises a methodology selected from the group consisting of a linear and non-linear least squares analysis.

9. A method for achieving CD uniformity in a feed forward multi-step plasma etching process comprising the steps of:

providing a semiconductor wafer having a process surface comprising a plurality of photoresist patterned features;

determining first critical dimensions (CD) of the photoresist patterned features;

carrying out a first plasma etching process to form a first plurality of etched features at first wafer temperatures according to at least two selectively controllable temperature zones;

determining a first CD variation of the plurality of etched features with respect to the first critical dimensions (CD) over areas of the process surface comprising the at least two selectively controllable temperature zones;

adjusting first wafer temperatures to second wafer temperatures for etching the plurality of etched features in a second plasma etching step to achieve a targeted second CD variation less than the first CD variation; and, carrying out the second plasma etching step at the second wafer temperatures.

10. The method of claim 9, wherein the at least two selectively controllable temperature zones are disposed radially concentric to one another contacting a backside of the semiconductor wafer.

11. The method of claim 9, wherein the steps of determining, adjusting, and plasma etching are sequentially repeated to approach a CD variation window.

12. The method of claim 9, wherein the step of adjusting wafer temperatures further comprises reference to a previously determined mathematical relationship between the wafer temperatures and CD variation.

13. The method of claim 9, wherein the step of adjusting wafer temperatures further comprises reference to archived values of wafer temperatures and CD variation.

14. The method of claim 13, wherein adjusting wafer temperatures comprises minimizing a difference between the targeted CD variation and archived CD variation.

15. The method of claim 9, further comprising the steps of:

determining the a second CD variation; and, adding the results of the second CD variation in association with the wafer temperatures to an archive.

16. The method of claim 15, wherein the archive comprises a relational database.

17. The method of claim 9, wherein the first and second CD variations are determined by scanning electron microscope examination.

18. The method of claim 1, wherein the first and second dimensional variation are determined by scanning electron microscope examination.

19. The method of claim 1, wherein the step of archiving a second dimensional variation comprises updating a database.

20. The method of claim 1, wherein the at least two selectively controllable temperature zones comprise temperatures selected from the group consisting of about the same temperatures and different temperatures.

* * * * *